United States Patent [19]
Cordoba et al.

[11] Patent Number: 5,461,590
[45] Date of Patent: Oct. 24, 1995

[54] LOW POWER VCC AND TEMPERATURE INDEPENDENT OSCILLATOR

[75] Inventors: Michael V. Cordoba; Kim C. Hardee, both of Colorado Springs, Colo.

[73] Assignees: United Memories Inc., Colorado Springs, Colo.; Nippon Steel Semiconductor Corp., Tokyo, Japan

[21] Appl. No.: 271,719

[22] Filed: Jul. 7, 1994

Related U.S. Application Data

[62] Division of Ser. No. 964,761, Oct. 22, 1992, Pat. No. 5,345,195.

[51] Int. Cl.⁶ ...................................................... G11C 7/00
[52] U.S. Cl. ............................................ 365/222; 365/194
[58] Field of Search .................................... 365/222, 194; 307/296.6, 296.1, 296.8; 323/313, 315, 907; 331/111, 143, 57

[56] References Cited

U.S. PATENT DOCUMENTS

| | | | |
|---|---|---|---|
| 4,135,125 | 1/1979 | Oura | 307/296.8 |
| 4,370,628 | 1/1983 | Henderson et al. | 331/111 |
| 4,495,425 | 1/1985 | McKenzie | 323/315 |
| 4,734,656 | 3/1988 | Miller | 331/111 |
| 4,999,814 | 3/1991 | Hashimoto | 365/222 |
| 5,315,230 | 3/1994 | Cordoba et al. | 323/313 |

OTHER PUBLICATIONS

Zhu, "Ultrastable Integrated CMOS Oscillator," International Journal of Electronics, vol. 70, No. 2, pp. 433–444, Feb. 1991, London, GB.

Abstract of Japanese patent document JP 22046088, Dec. 20, 1990.

Primary Examiner—David C. Nelms
Assistant Examiner—A. Zarabian
Attorney, Agent, or Firm—Edward D. Manzo

[57] ABSTRACT

A constant current source is used to provide a constant current to set a delay which defines the period of the output of the oscillator. The delay is preferably set by charging a capacitor with the constant current. Because the current is independent of variations in $V_{CC}$ and temperature, the capacitor will charge for a given period. Therefore, the frequency or period of oscillation will also be fixed and independent of variation in $V_{CC}$ or temperature. A current limiting circuit and latch are provided to generate an output which will be transmitted through one or a series of inverters. In an alternate embodiment, a differential amplifier is provided between the delay circuit and the current limiting circuit. This differential amplifier is typically needed in a case where VCC is not well-controlled to provide an output signal which has an appropriate voltage. A method of generating an oscillating output for refreshing a DRAM and a method for refreshing a DRAM are also disclosed.

23 Claims, 5 Drawing Sheets

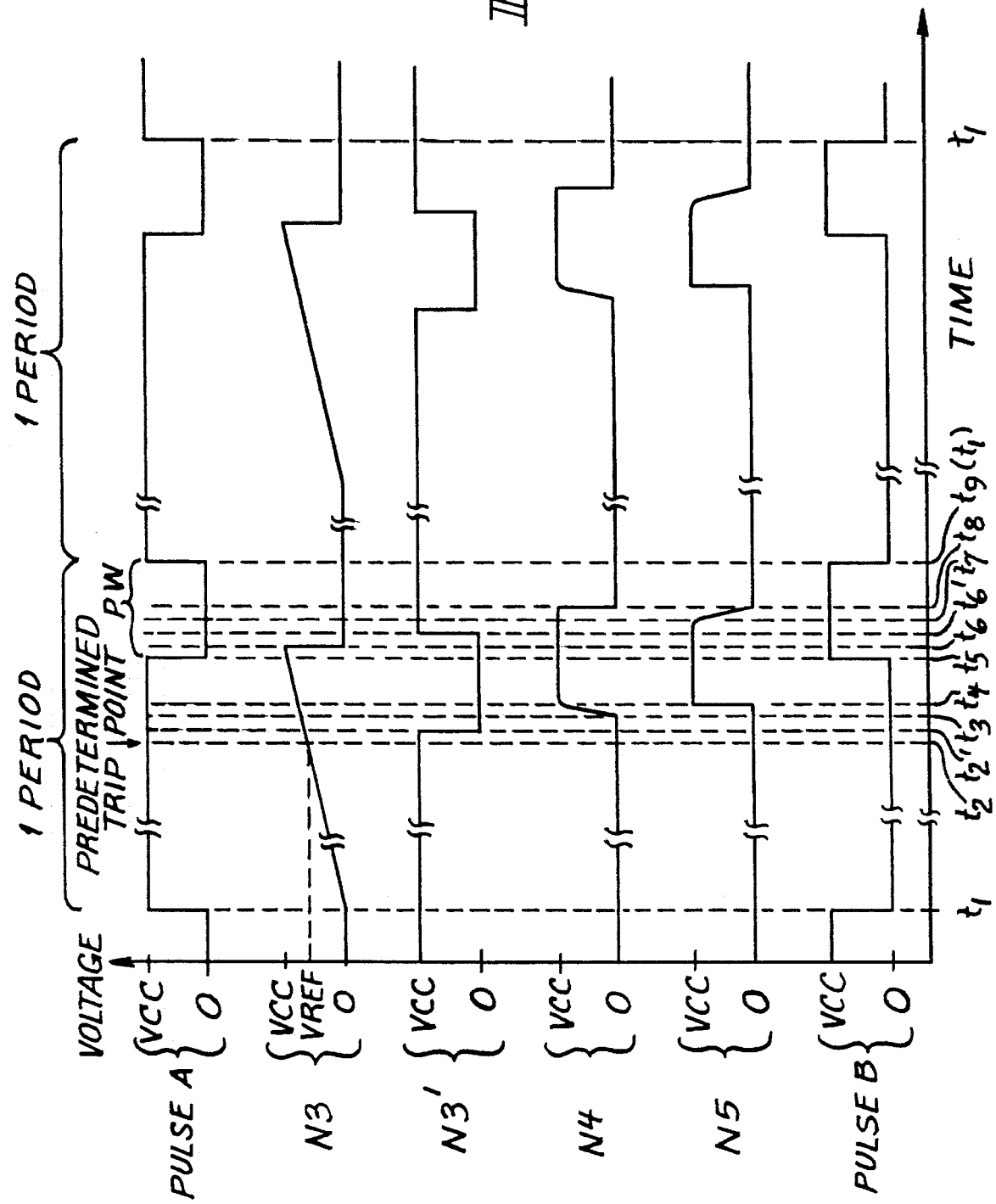

LOW POWER VCC AND TEMPERATURE INDEPENDENT OSCILLATOR

This application is divisional of U.S. application Ser. No. 07/964,761, filed on Oct. 22, 1992, now U.S. Pat. No. 5,345,195.

This invention relates to an oscillator, and more particularly to an integrated circuit oscillator which uses low power and provides an output which is (substantially) independent of most variations in power supply voltage and operating temperature.

DESCRIPTION OF THE PRIOR ART

Oscillators have been built using a set of n cascaded inverter gates, where n is an odd natural number. Typically, five or a larger odd number of inverter gates are used to generate an oscillating signal on the output. However, this type of cascaded oscillator can exhibit significant variations in frequency as a result of changes in $V_{CC}$ (power supply voltage to the chip or in the chip) or temperature. Specifically, the frequency can vary as much as 1.5 times the desired frequency with a 1 volt change in $V_{CC}$. Taking temperature variations into account, frequency changes can be as great as two times the desired frequency.

A further drawback of the simple cascaded inverter oscillator is the amount of current drawn in the circuit. A cascaded inverter oscillator can consume 100 microamperes (µA) of current. With a greater emphasis on portability, a low power oscillator for generating an output which is virtually independent of $V_{CC}$ and temperature variations is desired.

An object of the present invention is to provide an oscillator which is independent of variations in $V_{CC}$ and temperature.

Another object of the present invention is to provide a low power oscillator which limits the current and power dissipated.

A further object of the present invention is to provide a low power oscillator for refreshing a DRAM.

SUMMARY OF THE INVENTION

A constant current source which operates independently of $V_{CC}$ and temperature variations is used in the present invention to provide a constant current to set a delay. This delay primarily defines the period of the output of the oscillator. The delay is preferably set by charging a capacitor with the constant current. Because this current is relatively independent of variations in $V_{CC}$ and temperature, the frequency or period of oscillation will also be relatively independent of variations in $V_{CC}$ or temperature.

The present invention further includes a current limiting circuit and latch. The channel widths and lengths of the transistors in the current limiting circuit are chosen to reduce "through current" or "crowbar current." Also, the latch is a weak inverter designed to limit current loss and to prevent the output from floating. The output of the latch is transmitted through a series of inverters which define the pulse width of the output signal. The present invention is particularly useful in refreshing DRAMs, although other applications are contemplated.

In an alternate embodiment, a differential amplifier is provided between the delay circuit and the current limiting circuit. This differential amplifier is typically used where $V_{CC}$ is not well controlled in order to maintain the desired frequency of oscillation.

The design of the present invention is particularly useful in refreshing DRAMs, although the present invention can find application in any device employing an oscillator.

BRIEF DESCRIPTION OF THE DRAWINGS

FIG. 4 is a block diagram of a second embodiment of a low power VCC and temperature independent oscillator according to present invention.

FIG. 6 is a timing diagram of the clock signals generated at various nodes in the circuit and at output nodes of the second embodiment shown in FIG. 5.

DESCRIPTION OF THE PREFERRED EMBODIMENTS

Figure 1:
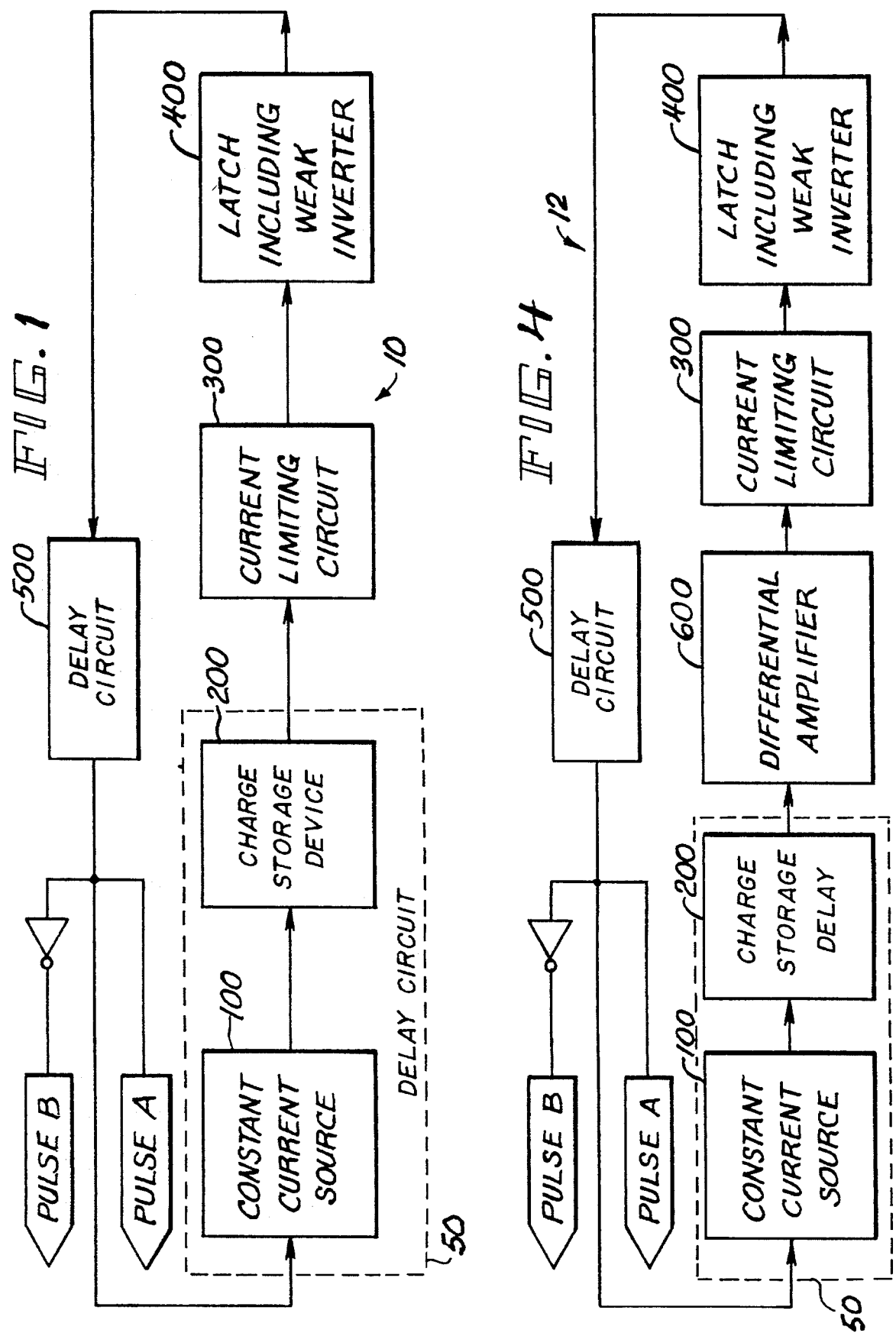
FIG. 1 is a block diagram of a first embodiment of a low power $V_{CC}$ and temperature independent oscillator according to present invention.

In FIG. 1, the block diagram of the first embodiment of an oscillator 10 according to the present invention includes a constant current source 100 which provides a current that is independent of variations in temperature and supply voltage $V_{CC}$. The first embodiment is designed to provide an output whose period is independent of variations in $V_{CC}$ of approximately ten percent. For example, for a 3 volt $V_{CC}$, the circuit will provide an output whose frequency will be substantially constant for variations of approximately 0.3 volts. Generally, the second embodiment is designed to provide an output having a constant frequency of oscillation for larger variations in $V_{CC}$.

In the first embodiment, a charge storage device 200, which is coupled to constant current source 100 at a node N1, primarily determines the period or frequency of the output pulse. Because the delay set by device 200 is determined by the current generated in circuit 100, and because circuit 100 provides a constant current, the period or frequency of the output signal is essentially constant. Circuit 100 and device 200 form a first delay circuit 50. Device 200 is coupled to a current limiting circuit 300, which is coupled to a latch circuit 400. A second delay circuit 500 is coupled between an output of circuit 400 and an input of circuit 100.

Since the output of delay circuit 200 is a slow changing signal, current (and therefore power) would be lost in inverters that are part of second delay circuit 500. To limit the amount of current dissipated in the circuit and reduce the power lost, current limiting circuit 300 is included. The current limiting circuit is designed to limit "through current" or "crowbar current" from $V_{CC}$ to ground in the inverters of the second delay circuit. Finally, the latch circuit 400 insures that the output of the delay circuit does not float and provides sharp transitions for input to the second delay circuit 500. An output and an inverted output of the second delay circuit are provided.

Figure 2:
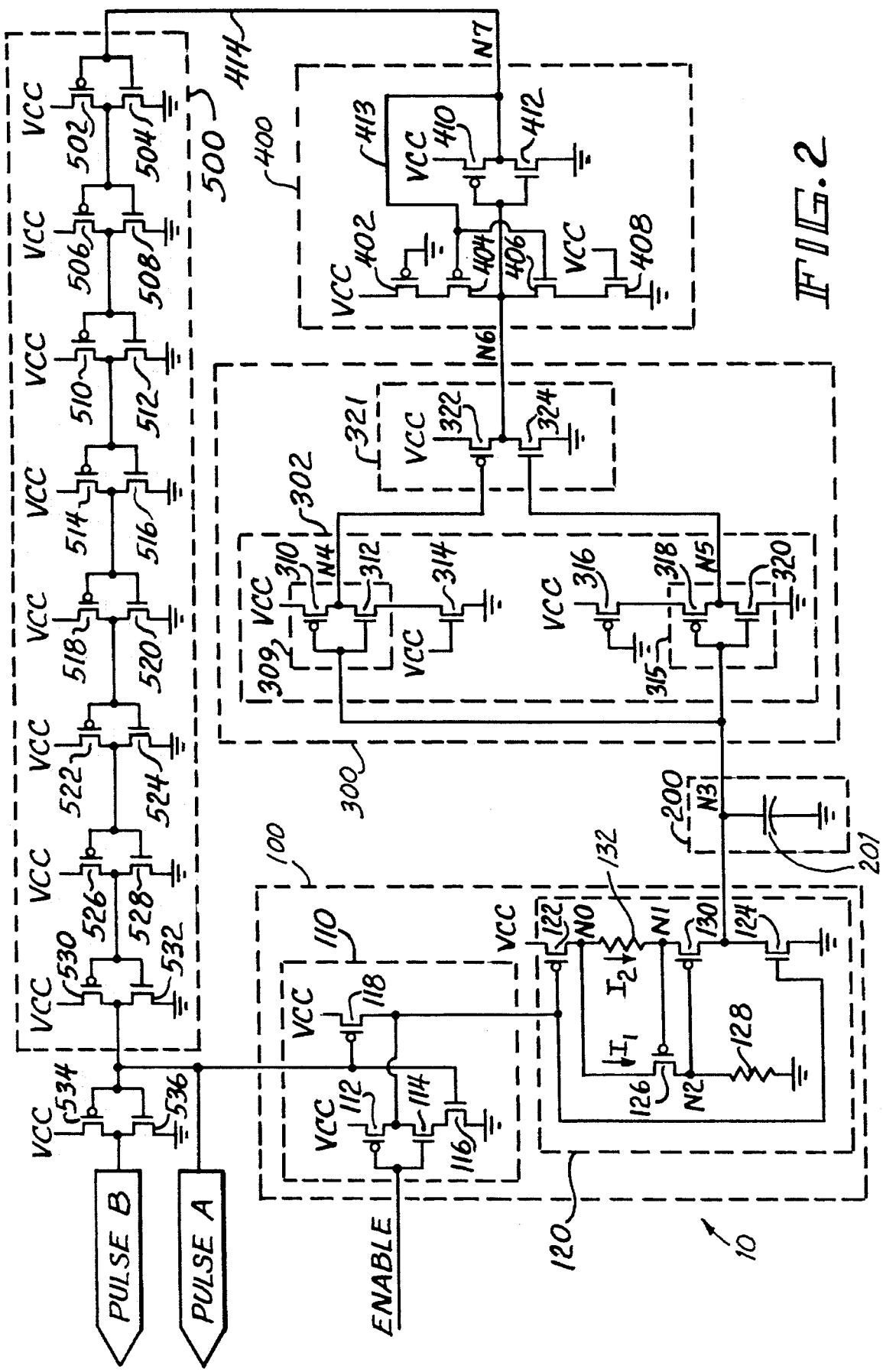
FIG. 2 is a detailed schematic of the oscillator of FIG. 1.

Turning now to FIG. 2, which also shows the FIG. 1 embodiment, constant current source 100 includes an enable NAND gate 110 and constant current circuit 120. NAND gate 110 is a conventional NAND gate which is well known in the art and includes transistors 112, 114, 116 and 118. One input to circuit 110 is the output of second delay circuit 500, which is a feedback Pulse A. The output of NAND gate 110 is coupled to the gate electrodes of transistors 122 and 124 of constant current circuit 120. Nodes N0, N1, and N2 are shown in circuit 120. A further node N3 is also associated with circuit 120 as well as charge storage device 200. Transistor 124 selectively couples node N3 to ground to discharge charge storage device 200. Transistor 122 selectively couples node N0 to $V_{CC}$ to charge storage device 200. Within circuit 120, currents $I_1$ and $I_2$ have been marked with corresponding arrows. Each such current has a respective path to ground.

When oscillator circuit 10 is not enabled or the output from the previous pulse A signal is low, the output of the NAND gate 110 is high, turning on transistor 124 and turning off transistor 122. As a result, no current flows from $V_{CC}$ through path $I_2$. However, node N3 is coupled to ground via transistor 124, thereby discharging a capacitor 201 of charge storage circuit 200. When oscillator 10 is enabled and the output of the oscillator (from a previous pulse A signal) is high, the output of NAND gate 110 is low. With a low output from NAND gate 110, p-channel transistor 122 is turned on and n-channel transistor 124 is turned off. Therefore, a current path is provided from VCC through the source-drain path of transistor 122, to node N1 via a resistor 132, and through the source-drain path of a transistor 130 to node N3 for charging capacitor 201.

Alternately, enable NAND 110 could be eliminated and a pulse B could be input to the constant current source at the gate of transistors 122 and 124. Pulse B will be understood to comprise an inversion of Pulse A. In this configuration, the oscillator would be a free running oscillator. However, the operation of the oscillator will be the same as the configuration employing pulse A as an input and using an enable NAND gate.

The operation of constant current source 100 is disclosed in U.S. Pat. No. 5,315,230, filed on Sep. 3, 1992, owned by the assignees of the present invention (attorney docket number UM-103), the entire specification of which is incorporated herein by reference. The current source 100 is preferably configured so that the voltage difference between nodes N1 and N2 will remain approximately the same despite variations in $V_{cc}$. Transistors 126 and 130 are preferably biased to their saturation regions. When these p-channel transistors are biased in their saturation region, their resistance remains substantially constant at varying temperatures. The current ($I_{DS}$) in the source-to-drain paths of transistors 126 and 130 when in saturation is represented by the following equation:

$$I_{DS}=(\beta W/L)(V_{GS}-V_T)^2$$

where $\beta$ is a constant which is equal to the thickness of the oxide multiplied by the mobility of the carriers of a saturated transistor, W is the channel width of a transistor, L is the channel length of the transistor, $V_{GS}$ is the voltage difference between the gate and source electrodes of the transistor, and $V_T$ is the threshold voltage of the transistor.

When $V_{CC}$ increases, the voltage at node N1 increases in such a manner that the voltage difference between nodes N0 and N1 (i.e. $V_{GS}$ of transistor 126) increases the source-to-drain current $I_1$ (which is dependent on $V_{GS}$ as shown in the equation above) through transistor 126 and resistor 128. Also, the increased current $I_1$ causes the voltage at a node N2 to increase simultaneously with node N1. Therefore, the voltage difference between nodes N1 and N2 (i.e. $V_{GS}$ of transistor 130) is substantially the same and maintains a substantially constant current $I_2$.

Alternatively, as $V_{cc}$ decreases, the voltage at node N1 (and the voltage difference between nodes N1 and N2) decreases. Current $I_1$ also decreases, causing the voltage at node N2 to decrease along with the decreasing voltage at node N1. Therefore, the voltage difference between nodes N1 and N2 of transistor 130 remains the same and current $I_2$ remains substantially constant.

Preferably, the values of resistors 128 and 132 are large (e.g. 1000 KΩ) and the width/length ratios of the transistor are small to limit the current in the constant current source and consume less power in the oscillator. The preferred channel widths and lengths of all transistors in the figures are shown in Appendix A, although other dimensions could be used within the scope of the invention. Based upon the preferred component values, current $I_1$ would be 1.5 µA–1.0 µA, while current $I_2$ would be substantially constant between 0.5 µA–1.0 µA. Finally, temperature dependent resistors could be used in the constant current source to further reduce the dependence of the output current on temperature variations.

The constant current generated by current source 100 is used to charge storage device 200. Preferably the device 200 is a capacitor 201, such as a transistor which is biased as a capacitor by coupling the source and the drain electrodes. For example, the capacitor could be a p-channel transistor with its gate electrode coupled to node N3 and its source and drain electrodes coupled to $V_{cc}$. Alternatively, an n-channel transistor with its gate electrode coupled to node N3 and its source and drain electrodes coupled to ground could be used. The preferred value of the capacitor is approximately 2.4 pf to provide a 10 nsec delay. Because the delay is dependent upon the value of the capacitance, a desired delay can be obtained by selecting the appropriate capacitance. However, any other suitable circuit for outputting a signal after a delay could be used.

Because the charging of capacitor 201 provides a slow changing signal at node N3, current limiting circuit 300 is preferably used to limit any "through current" or "crow bar current" which results in power loss and to generate an output signal at a node N7 which is a suitable input to second delay circuit 500. Specifically, when a slow changing signal (i.e. a signal which does not have a sharp transition between low and high states) is input to an inverter consisting of two transistors such as those shown in circuit 500, both transistors of the inverter will be on for a certain period of time. Therefore, there is often current loss from $V_{CC}$ to ground through the inverter during the transition.

To compensate for the slow changing signal at node N3, current limiting circuit 300 and latch circuit 400 are specifically designed to reduce the through current in the inverters and to output an oscillating signal having a sharp transition. The switching time of transistors is generally dependent on the channel width/length ratio. Therefore, the channel widths and lengths can be chosen to establish when the transistors of an inverter will switch. Because the widths of the transistors in current limiting circuit 300 are the same, the switching time will be a function of their channel lengths. The channel lengths of the transistors 310, 312, 318 and 320 of circuit 300 are chosen so that the voltages at nodes N4 and N5 (and therefore the gate electrodes of transistors 322 and 324 of circuit 300) switch at an appropriate time. Specifically, when the output (node N6) of converter 321 transitions from a low signal to a high signal as capacitor 201 charges, it is beneficial to turn off transistor 324 before turning on transistor 322 to limit through current from $V_{CC}$ to ground. The length of transistor 312 is generally longer than that of transistor 320 to ensure that transistor 322 turns on after transistor 324 turns off.

In contrast, when the output from the constant current source at node N3 transitions from a high voltage to a low voltage as capacitor 201 is discharging, it is beneficial to turn off transistor 322 before turning on transistor 324 to limit through current from $V_{CC}$ to ground. To accomplish the switching of the transistors of inverter 321 in this order, the length of transistor 318 is generally longer than that of transistor 310 to ensure that transistor 324 turns on after transistor 322 turns off.

To further limit through current in the oscillator circuit, transistors 314 and 316 are added to inverter 302 to reduce any through current in inverters 309 and 315. Because of the current limiting transistors 314 and 316 have long channel lengths, nodes N4 and N5 will not be pulled rapidly to ground and $V_{CC}$, respectively. Therefore, the path from $V_{CC}$ to ground will exist while driving transistors 322 and 324, but the current will be reduced in the series of transistors 310–314 and 316–320 by the channel lengths of transistors 314 and 316.

Also, transistors 314 and 316 are selectively positioned to ensure that the timing of the switching of the transistors as described above is not affected. When node N3 transitions from low to high, it is preferred that the inverter 315 drive N5 low very quickly by turning on transistor 320 to shut off transistor 324. Hence, the current limiting transistor 316 is added only to the p-channel side of inverter 315 to limit the effect of transistor 316 on transistor 320. While current limiting transistor 316 does affect the timing of driving node N5 high when node N3 transitions from high to low, the capacitive coupling of transistor 316 to node N5 is large enough to pull node N5 high enough to turn on transistor 324 at an appropriate time.

Similarly, when node N3 is transitioning from high to low, it is preferable that the inverter 309 drive N4 high very quickly by turning on transistor 310 to shut off transistor 322. Therefore, current limiting transistor 314 is added only to the n-channel side of the inverter 309 to limit the effect of current limiting transistor 314 on transistor 310. While current limiting transistor 314 does affect the timing of driving node N4 low when node N3 transitions from low to high, the capacitive coupling of transistor 314 to node N4 is large enough to pull node N4 low enough to turn on transistor 322 at an appropriate time. Therefore, the selection of channel lengths of the transistors eliminate any path from $V_{CC}$ to ground during the charging and discharging of capacitor 201.

Latch 400 is also included in oscillator 10 to maintain the output of the current limiting circuit during the period when neither transistor 322 nor transistor 324 of inverter 321 is driven (as discussed above to prevent through current). The output signal at node N7 is fed back via line 413 to transistor network 402–408 to maintain the original voltage at node N6 until the state of node N6 changes when inverter 321 drives node N6.

In order to reduce power consumption in the oscillator, latch 400 itself is designed to limit through current while also providing a weak latch. Transistors 322 and 324 are generally small transistors (i.e. small widths and lengths) to limit current through inverter 321. However, because of their size, they generally cannot drive a large capacitive load at node N6. Too large a capacitive load at node N6 is undesirable because this capacitance will cause the voltage at the node to switch slowly. Therefore, a weak latch is provided at node N6 by selecting transistors 404 and 405 to have smaller widths and lengths, preferably on the order of 1–2 μm, to limit the capacitance at node N6.

However, because transistors 404 and 406 of the latch have widths and lengths which are about equal, they also have a large width/length ratio and generally drive greater current. Therefore, current limiting transistors 402 and 408 are included. These transistors have long channel lengths (and therefore small width/length ratios) to limit the current in the latch 400 and reduce power consumption in the circuit.

The output signal of the latch circuit 400 at node N7 is coupled to the output of second delay circuit 500. This circuit includes a series of inverters for generating an output signal (pulse A) and an inverted output signal (pulse B). While any even number of inverters can be used to generate pulse A, eight inverters comprising pairs of transistors 502–532 are shown in FIG. 2. As will be described in more detail in reference to the operation, these inverters generally determine the pulse width of the output pulse. However, the pulse width is considerably shorter than the period of oscillation of oscillator 10. For example, the pulse width is preferably 50 to 100 nanoseconds while the period is approximately 10 microseconds (10,000 nanoseconds). Therefore, while the inverters (and therefore the pulse width) may be affected by variations in $V_{cc}$ or temperature, it is apparent that these variations do not significantly affect the period or frequency of oscillation.

Figure 3:
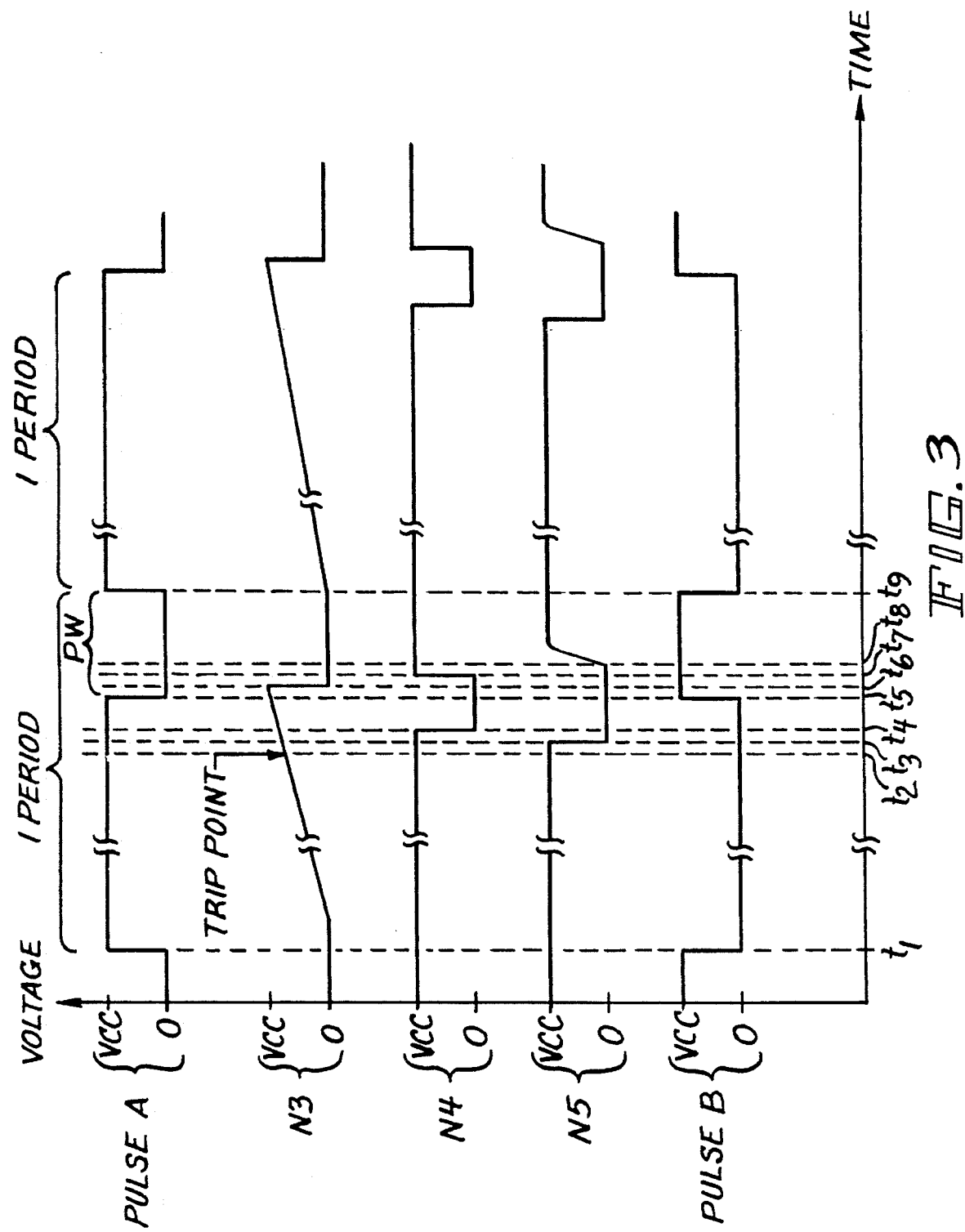
FIG. 3 is a timing diagram showing the voltages at various nodes in the circuit and at output nodes of first embodiment shown in FIG. 2.

The operation of oscillator circuit 10 is now described with reference to FIG. 3. The timing diagram of FIG. 3 shows the signals at various nodes of the oscillator. Assuming the Enable signal input to NAND gate 101 of the constant current source 100 is high and oscillator 10 is enabled, the output of the oscillator is dependent upon pulse A which is fed back to the constant current source 100. Because pulse A is high at a time $t_1$, transistor 122 is on and transistor 124 is off, thereby providing a current path from $V_{CC}$ to node N3. As the current flows through the path, the voltage at node N3 increases as the capacitor 201 charges.

At a time $t_2$, the charge at node N3 reaches a "trip point." At the trip point, the voltage at node N3 has reached a large enough value to cause inverters 309 and 315 to switch. At a time $t_3$, the voltage at node N5 transitions to a low level to turn off transistor 324. At a time $t_4$, the voltage at node N4 transitions to a high level to turn on transistor 322 and invert the signal at node N6 and drive the input of the second delay circuit 500 at node N7. As discussed earlier, node N5 goes low before the voltage at node N4 to prevent any through current through transistors 322 and 324.

Because an odd number of inversions occur in the circuit between node N6 and the output pulse A, the output of oscillator 10 (pulse A) will be inverted with respect to the signal at node N6 at time $t_5$. At a time $t_5$, pulse A (after nodes N4 and N5 transition low and the signal passes through the inverters of delay circuit 500) transitions to a low level, causing the voltage at node N3 to transition low a time at $t_6$. Because capacitor 201 is discharging to ground, node N3 transitions to a low level quickly. Nodes N4 and N5 transition high at times $t_7$ and $t_8$, driving the input to circuit 500 at node N7. As described earlier, the timing of the transitions of the signals at nodes N4 and N5 is selectively chosen to limit any through current in the inverter 321. The output at node N7 is input into circuit 500. The signal is passed through a series of inverters (including pairs of transistors 502–536) to output pulse A and pulse B signals. At a time $t_9$, the output of pulse A again transitions, beginning a new period.

As is apparent from FIG. 3, the pulse width PW, which is defined between $t_5$ and $t_9$, is determined by the number of inverters in the circuit and is therefore generally short. When pulse A transitions to a low level, transistor 122 is turned off and transistor 124 is turned on, coupling node N3 to ground and discharging capacitor 201. Because the voltage at node N3 will quickly reach ground potential, inverters 309 and 315 will quickly provide an inverted output which will be propagated through the remaining inverters. Therefore, the pulse width PW (i.e. the period when pulse A is low) will generally be short.

The remaining portion of the period (between $t_1$ and $t_5$) is determined by the amount of time required to charge capacitor 201 to the trip point voltage at time $t_2$ to drive pulse A low at time $t_5$ (after the high input signal from pulse A propagates through the circuit after the trip point). As stated earlier, the time to charge storage device 200 is generally independent of variations in $V_{CC}$ and temperature because of the constant current source 100. Because the time to charge capacitor 201 is generally long and defines the majority of the period, the period or frequency of oscillation of circuit 10 will depend on the charging time and will be substantially independent of variations in temperature and $V_{cc}$.

One particularly useful application of the present invention can be found in a method of refreshing DRAMs. Typically, the frequency of oscillation of a conventional oscillator will increase with an increase in $V_{CC}$. However, an oscillator whose frequency of oscillation decreases with an increase in $V_{CC}$ is beneficial in clocking the counter to enable the refresh in a DRAM. Specifically, a DRAM operating with a smaller $V_{CC}$ value means that the amount of charge stored in memory cell capacitors is smaller. From this, it follows that such memory cells will need to be refreshed more often because the time required to discharge the charge stored on the memory cell capacitors will be shorter. Conversely, a DRAM operating with a larger value of $V_{CC}$ will not need to be refreshed as often because the time required to discharge the stored charge will be longer (i.e. because the stored charge is greater with a 5 volt $V_{CC}$ compared to a 3 volt $V_{CC}$). Therefore, it is beneficial to have an oscillator whose frequency is inversely proportional to $V_{CC}$ for different values of $V_{CC}$—for example a three (3) volt or five (5) volt $V_{CC}$.

While the first embodiment provides an output having a substantially constant frequency of oscillation despite limited variations for a given $V_{CC}$ (i.e. variations of approximately ten percent of $V_{CC}$), when any variations in frequency occur, they are inversely proportional to $V_{CC}$. Further, the frequency of oscillation of the first embodiment is inversely proportional to the value of $V_{CC}$ for different values of $V_{CC}$ (for example, 3 volts versus 5 volts). Therefore, the first embodiment can be employed in a circuit having different values of $V_{CC}$ and provide an appropriate frequency (depending on the value of $V_{CC}$) to refresh the DRAM.

Figure 5:
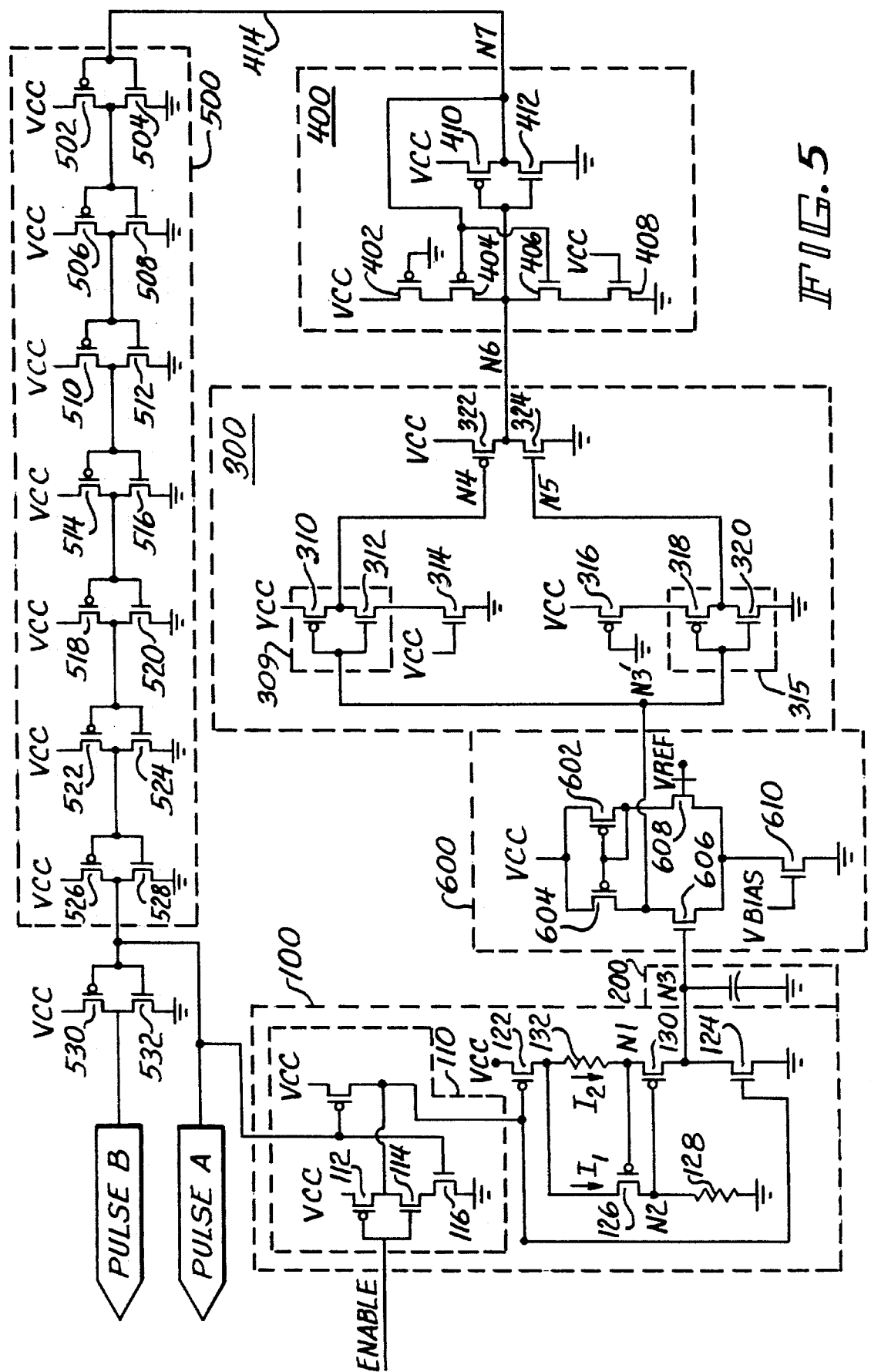
FIG. 5 is a detailed schematic of the second embodiment shown in FIG. 4.

A second embodiment of the present invention is a oscillator 12 shown in FIG. 4. Like parts have like reference numerals. A differential amplifier 600 is added between charge storage device 200 and the current limiting circuit 300 to prevent variations in the frequency of oscillation when $V_{CC}$ is less stable or experiences large variations (i.e. variations greater than approximately ten percent of $V_{CC}$). Specifically, differential amplifier 600 including transistors 602, 604, 606 and 608, shown in the detailed circuit diagram in FIG. 5, provides an output signal at node N4 which is independent of variations in $V_{CC}$. Because inverters transitions at approximately $V_{CC}/2$ (i.e. the trip point), the amount of time to charge device 200 (and therefore the period of oscillation) may vary greatly with great variations in $V_{CC}$. Specifically, it may take additional time to reach the trip point when $V_{CC}$, for example, increases greatly.

Differential amplifier 600 is added to clamp node N4 to $V_{CC}$ as soon as node N3 charges to a predetermined trip point. This predetermined trip point can be established by the a reference voltage input VREF at the gate of transistor 608. The operation of the differential amplifier 600 is well known in the art and is therefore not described in detail.

As is shown in FIG. 6, the voltage at node N3' transitions from $V_{CC}$ to ground at time $t_2'$ after node N3 reaches the predetermined trip point (at time $t_2$). Because the predetermined trip point is defined by the differential amplifier 600 and is independent of variations in $V_{CC}$, the time required to charge the capacitor to the trip point and therefore the period of oscillation is independent of variations in $V_{cc}$. The remaining portions of the oscillator 12 operate identically to those of oscillator 10 set forth previously.

Thus, to summarize: the oscillator of the present invention employs a capacitor to set delay which generally defines the period of oscillation. Because a constant current source is used to charge the capacitor and set the delay, the period of oscillation is substantially constant. Although the pulse width of the oscillator is affected by variations in $V_{CC}$ or temperature, the pulse width is substantially shorter than the overall period of oscillation. In an alternate embodiment, a differential amplifier is used to ensure that the period of oscillation is substantially constant even with great variations in $V_{CC}$.

While this invention has been described with reference to two illustrative embodiments, it will be understood that this description is not intended to be construed in the limitative sense, but is intended to embrace any substitutes within the scope of the invention. Various modifications of the illustrative embodiments, as well as other embodiments, will become apparent to those skilled in the art upon reference to this description. The invention is intended to be set forth in the appended claims.

APPENDIX A

| TRANSISTOR NUMBER | WIDTH IN MICROMETERS (Width for 3 V Vcc) | LENGTH IN MICROMETERS (Length for 3 V Vcc) |
| --- | --- | --- |
| 112–118 | 4 | 2 |
| 122 | 2 | 2 |
| 124 | 16 | 2 |
| 126 | 20 | 1.2 |
| 130 | 4 | 10 |
| 200 | 120 | 10 |
| 310 | 2 | 1.2 |
| 312 | 2 | 3 |
| 314 | 1 | 160 |
| 316 | 1 | 80 |
| 318 | 2 | 2 |
| 320 | 2 | 1 |
| 322 | 2 | 1.2 |
| 324 | 1 | 1 |
| 402 | 1 | 100 |
| 404 | 2 | 1.2 |
| 406 | 1 | 1 |
| 408 | 1 | 200 |
| 410 | 2 | 1.2 |
| 412 | 1 | 1 |
| 502 | 4 | 1.2 |
| 504 | 2 | 1 |
| 506 | 2 | 6 |
| 508 | 2 | 6 |
| 510 | 10 | 10 |
| 512 | 10 | 10 |
| 514 | 2 | 2 |
| 516 | 2 | 2 |
| 518 | 2 | 2 |
| 520 | 1 | 2 |
| 522 | 4 | 2 |
| 524 | 2 | 2 |
| 526 | 4 | 2 |
| 528 | 2 | 2 |

APPENDIX A-continued

| TRANSISTOR NUMBER | WIDTH IN MICROMETERS (Width for 3 V Vcc) | LENGTH IN MICROMETERS (Length for 3 V Vcc) |
| --- | --- | --- |
| 530 | 4 | 1.2 |
| 532 | 2 | 1 |
| 534 | 16 | 1.2 |
| 536 | 8 | 1 |

We claim:

1. A method of refreshing a DRAM comprising the steps of:
   providing an oscillating output signal using said oscillating output signal to clock a counter to enable the refresh in the DRAM, wherein the step of providing an oscillating output signal comprises the steps of:
   providing a constant current using a low power constant current source;
   generating a first delay based upon the constant current;
   generating a second delay: and
   outputting an oscillating signal based on said first and second delays, wherein the period of oscillation of said oscillating signal is substantially determined by said first delay.

2. The method of claim 1 wherein said constant current is substantially independent of variations in supply voltage VCC and temperature.

3. The method of claim 1 wherein said constant current source is a single current source.

4. The method of claim 1 wherein said first delay is a controlled first delay and wherein said second delay is generated based on a series of cascaded inversions, and wherein the method further includes using an electrical signal that is generated subsequent to said first delay for generating further iterations of said controlled first delay.

5. The method of claim 1 wherein said delay increases slightly with an increase in supply voltage VCC.

6. A method of refreshing a DRAM comprising the steps of:
   providing an oscillating output signal and using said oscillating output signal to clock a counter to enable the refresh in said DRAM, wherein said step of providing an oscillating output signal comprises the steps of:
   providing a constant current using a low power current source;
   generating a controlled first delay based upon the constant current;
   generating a second delay based on a series of cascaded inversions;
   using an electrical signal that is generated subsequent to said first delay for generating further iterations of said controlled first delay; and
   outputting an oscillating signal wherein the period of oscillation of said oscillating signal is substantially determined by said first delay.

7. The method of refreshing a DRAM of claim 6 wherein the step of generating said first delay includes charging a capacitor to a certain voltage.

8. The method of refreshing a DRAM of claim 7 wherein the step of generating said first delay further includes inputting the voltage of the charged capacitor to a differential amplifier to provide a high output when the voltage has reached a predetermined level.

9. The method of claim 6 wherein said constant current is substantially independent of variations in supply voltage VCC and temperature.

10. The method of claim 6 wherein said constant current source is a single current source.

11. The method of claim 6 wherein said delay increases slightly with an increase in supply voltage VCC.

12. The method of claim 1 wherein said step of providing an oscillating output signal includes generating a recurring time-varying signal having a first state followed by a second state;
    wherein the method includes separately determining the durations of the first and second states of the oscillating output signal;
    wherein the duration of the first state is substantially determined by the delay based on the constant current.

13. The method of claim 12 wherein the duration of the second state of the oscillating output signal is not determined by the delay based on the constant current.

14. The method of claim 6 wherein said step of providing an oscillating output signal includes generating a recurring time-varying signal having a first state followed by a second state;
    wherein the method includes separately determining the durations of the first and second states of the oscillating output signal;
    wherein the duration of the first state is substantially determined by the delay based on the constant current.

15. The method of claim 14 wherein said separately determining comprises traversing a circuit loop a first time for determining the duration of the first state and then traversing the circuit loop a second time for determining the duration of the second state, wherein traversing the loop the first time includes using the constant current for changing a voltage thereby to generate said controlled first delay, but traversing the loop said second time does not use the constant current for changing a voltage over said controlled first delay,
    so that the duration of the second state of the oscillating output signal is not substantially determined by the first controlled delay based on the constant current.

16. A method of refreshing a DRAM comprising the steps of:
    generating an oscillating output signal and using said oscillating output signal to clock a counter to enable the refresh in said DRAM, wherein said step of providing an oscillating output signal comprises the steps of:
    generating a first state and a second state for the oscillating output signal, and repeating said generating steps;
    wherein said step of generating a first state includes providing a constant current using a low power current source, generating a controlled first delay based upon the constant current, and outputting said first state;
    wherein said step of generating a second state includes generating a second delay based on a series of cascade, inversions and outputting said second state.

17. The method of claim 16 wherein said step of generating said first state further includes generating a series of inversions, and providing said first state.

18. The method of claim 17 wherein said step of generating a second delay includes generating said series of inversions.

19. The method of claim 16 wherein said step of generating said first state includes generating said first delay based on said constant current, and then generating delay via a series of cascaded inversions;
    and said step of generating a second state includes bypassing said delay based on said constant current and generating said second delay via said series of cascaded inversions.

20. The method of claim 16 wherein said step of generating a first state comprises traversing a circuit loop a first time for determining the duration of the first state;

wherein said step of generating a second state comprises traversing said circuit loop a second time for determining the duration of the second state, wherein said traversing the loop the first time includes using the constant current for changing a voltage thereby to generate a controlled first delay, wherein traversing the loop said second time does not use the constant current for changing a voltage over said controlled first delay, wherein traversing the loop includes generating said second delay based on a series of cascaded inversions.

21. The method of refreshing a DRAM of claim 20 wherein providing an oscillating output further includes the steps of:

providing a constant current source;

generating a delay based upon the constant current; and outputting an oscillating signal wherein the period of oscillation is substantially determined by the delay.

22. The method of refreshing a DRAM of claim 1 wherein the constant current source includes first and second p-channel transistors coupled between a first and second voltage;

wherein the gate of the first transistor is coupled to the source of the second transistor and the gate of the second transistor is coupled to the drain of the first transistor;

first and second resistors wherein said first resistor is coupled between the drain of the first transistor and the first voltage and the second resistor is coupled between the source of the second transistor and the second voltage; and wherein the source of the first transistor is coupled to the second voltage and the drain of the second transistor outputs a constant current.

23. The method of refreshing a DRAM of claim 1 wherein the step of generating a delay includes charging a capacitor to a certain voltage.

* * * * *